United States Patent
Zhong (10) Patent No.: US 11,871,545 B2
(45) Date of Patent: Jan. 9, 2024

(54) COOLING CABINET AND COOLING SYSTEM

(71) Applicant: Alibaba Group Holding Limited, Grand Cayman (KY)

(72) Inventor: Yangfan Zhong, Hangzhou (CN)

(73) Assignee: Alibaba Group Holding Limited, Grand Cayman (KY)

(*) Notice: Subject to any disclaimer, the term of this patent is extended or adjusted under 35 U.S.C. 154(b) by 583 days.

(21) Appl. No.: 16/760,007

(22) PCT Filed: Oct. 25, 2018

(86) PCT No.: PCT/CN2018/111821
§ 371 (c)(1),
(2) Date: Apr. 28, 2020

(87) PCT Pub. No.: WO2019/085813
PCT Pub. Date: May 9, 2019

(65) Prior Publication Data
US 2020/0352058 A1 Nov. 5, 2020

(30) Foreign Application Priority Data
Nov. 3, 2017 (CN) .......................... 201711073039.6

(51) Int. Cl.
*H05K 7/20* (2006.01)

(52) U.S. Cl.
CPC ..... *H05K 7/20781* (2013.01); *H05K 7/20272* (2013.01)

(58) Field of Classification Search
CPC .................. H05K 7/20272; H05K 7/20781

USPC ........................................................ 165/80.4
See application file for complete search history.

(56) References Cited

U.S. PATENT DOCUMENTS

| | | | |
|---|---|---|---|
| 8,035,972 B2 | 10/2011 | Ostwald et al. | |
| 8,780,552 B2 | 7/2014 | El-Essawy et al. | |
| 8,830,672 B2 | 9/2014 | Alshinnawi et al. | |
| 9,204,576 B2 * | 12/2015 | Goulden | H05K 7/20218 |
| 9,258,926 B2 * | 2/2016 | Smith | H05K 7/20709 |
| 9,326,430 B2 * | 4/2016 | Neumann | H05K 7/20709 |
| 9,351,429 B2 * | 5/2016 | Shelnutt | H05K 7/203 |

(Continued)

FOREIGN PATENT DOCUMENTS

| | | |
|---|---|---|
| CN | 104284536 | 1/2015 |
| CN | 104284536 A * | 1/2015 |

(Continued)

*Primary Examiner* — Claire E Rojohn, III (57) ABSTRACT

A cooling cabinet is configured to cool a to-be-cooled device and includes a cabinet body, a first diversion assembly, and a second diversion assembly. The cabinet body can contain a cooling medium for at least partially immersing the to-be-cooled device, and the cabinet body has a first diversion inlet for introducing the cooling medium and also has a first diversion outlet for discharging the cooling medium. The first diversion assembly is coupled to the first diversion inlet, and the first diversion assembly has a second diversion outlet for discharging the cooling medium into the cabinet body. The second diversion assembly is coupled to the first diversion outlet, and the second diversion assembly has a second diversion inlet for introducing the cooling medium to flow through the to-be-cooled device.

12 Claims, 7 Drawing Sheets

(56) References Cited

U.S. PATENT DOCUMENTS

| | | | |
|---|---|---|---|
| 9,408,332 B2 * | 8/2016 | Smith | H05K 7/20818 |
| 9,491,892 B1 | 11/2016 | Carlson et al. | |
| 9,596,787 B1 * | 3/2017 | Iyengar | H05K 7/20327 |
| 9,606,588 B2 * | 3/2017 | Dean | H05K 7/20754 |
| 9,699,939 B2 * | 7/2017 | Smith | H05K 7/20236 |
| 9,763,364 B1 | 9/2017 | Amoah-Kusi | |
| 9,839,162 B2 | 12/2017 | Crawford | |
| 9,907,206 B2 * | 2/2018 | Branton | H05K 7/20263 |
| 9,936,612 B2 | 4/2018 | Goulden et al. | |
| 10,015,912 B2 * | 7/2018 | Inano | H05K 7/20236 |
| 10,130,013 B1 | 11/2018 | Iyengar et al. | |
| 10,136,551 B2 | 11/2018 | Branton | |
| 10,212,849 B2 | 2/2019 | Matsumoto et al. | |
| 10,410,955 B2 | 9/2019 | Tsai et al. | |
| 10,613,601 B2 | 4/2020 | Eriksen | |
| 10,806,056 B2 | 10/2020 | Cuda et al. | |
| 10,881,031 B2 | 12/2020 | Luo et al. | |
| 10,888,029 B2 | 1/2021 | Jochim et al. | |
| 10,917,998 B2 | 2/2021 | Shelnutt et al. | |
| 10,939,590 B2 | 3/2021 | Bonnin et al. | |
| 2003/0123225 A1 | 7/2003 | Miller | |
| 2015/0181762 A1 | 6/2015 | Boyd et al. | |
| 2017/0156233 A1 | 6/2017 | Moss et al. | |
| 2017/0265328 A1 | 9/2017 | Sasaki et al. | |

FOREIGN PATENT DOCUMENTS

| | | |
|---|---|---|
| CN | 204231772 | 3/2015 |
| CN | 204810797 | 11/2015 |
| CN | 105487624 | 4/2016 |
| CN | 207519034 | 6/2018 |
| CN | 207519034 U * | 6/2018 |

* cited by examiner

COOLING CABINET AND COOLING SYSTEM

REFERENCE TO RELATED APPLICATIONS

The present application claims priority to Chinese Patent Application No. 201711073039.6, entitled "Cooling Cabinet and Cooling System" and filed on Nov. 3, 2017, and to PCT application PCT/CN2018/111821, entitled "Cooling Cabinet and Cooling System" and filed on Oct. 25, 2018, the contents of which are incorporated herein by reference in their entirety.

BACKGROUND

With the rapid development of cloud computing technology (e.g., large-scale distributed system technology), the requirements for the computing performance of servers are increasing. With improving server performance, power consumption is also increasing rapidly, at an exponential rate. Data shows that the power consumption per data center server has increased by nearly a factor of 15 in the past decade. In the past, the power consumption of a server was generally 1.5 kW-2 kW. However, the power consumption of some contemporary servers has reached as high as 20 kW-30 kW.

At present, servers in data centers are usually cooled using air conditioning and air cooling, which can consume a large amount of energy, space and cost, and such consumption is increasing. However, with the steady increase in power consumption per unit, the cooling capacity provided by many data centers is currently approaching their limit, and so the trend of increasing power density will have an adverse effect. Therefore, conventional air conditioning and air cooling have been unable to meet the cooling demand of servers in data centers.

SUMMARY

Embodiments according to the present disclosure provide a cooling cabinet and a cooling system to improve the cooling efficiency for the servers in a data center.

According to a first aspect of the embodiments of the present disclosure, a cooling cabinet for cooling a to-be-cooled device includes a cabinet body, a first diversion assembly, and a second diversion assembly. The cabinet body may contain a cooling medium for at least partially immersing the to-be-cooled device, and the cabinet body has a first diversion inlet for introducing the cooling medium and a first diversion outlet for discharging the cooling medium. The first diversion assembly is coupled to the first diversion inlet, and the first diversion assembly has a second diversion outlet for discharging the cooling medium into the cabinet body. The second diversion assembly is coupled to the first diversion outlet, and the second diversion assembly has a second diversion inlet for introducing the cooling medium through the to-be-cooled device.

Furthermore, the first diversion inlet is located above the first diversion outlet, the first diversion assembly is located at the top of the to-be-cooled device, and the second diversion assembly is located at the bottom of the to-be-cooled device.

Furthermore, the first diversion inlet is located below the first diversion outlet, the first diversion assembly is located at the bottom of the to-be-cooled device, and the second diversion assembly is located at the top of the to-be-cooled device.

Furthermore, the first diversion assembly includes a loop tube portion and a first diversion portion coupled to the loop tube portion. The first diversion portion is coupled to the first diversion inlet, and at least one of the loop tube portion and the first diversion portion has the second diversion outlet.

Furthermore, the loop tube portion is a rectangular loop tube structure and includes two first tube bodies and two second tube bodies that are coupled to each other and are connected into an enclosure. The first diversion portion is coupled to any of the first tube bodies, and at least one of the first tube bodies, the second tube bodies, and the first diversion portion has the second diversion outlet.

Furthermore, there are two first diversion inlets, which are respectively disposed on two sides of the cabinet body, and there are two first diversion portions that communicate with the two first tube bodies in one-to-one correspondence.

Furthermore, each of the two first tube bodies is integral with at least one of the adjacent second tube bodies.

Furthermore, there are multiple second diversion outlets, which are uniformly arranged on a side wall of at least one of the first tube bodies, the second tube bodies, and the first diversion portions.

Furthermore, the second diversion assembly includes a tube bank portion and a second diversion portion coupled to the tube bank portion, the second diversion portion is coupled to the first diversion outlet, and the tube bank portion has the second diversion inlet.

Furthermore, the tube bank portion is a rectangular tube bank structure and includes two third tube bodies and multiple fourth tube bodies connected between the two third tube bodies. The fourth tube bodies are coupled to the two third tube bodies. The second diversion portion is coupled to any of the third tube bodies, and the fourth tube bodies have the second diversion inlets.

Furthermore, there are two first diversion outlets, which are respectively disposed on two sides of the cabinet body, and there are two second diversion portions that are coupled to the two third tube bodies in one-to-one correspondence.

Furthermore, the fourth tube bodies include two groups arranged in a staggered manner. One group of the fourth tube bodies and one of the third tube bodies are integral, and the other group of the fourth tube bodies and the other third tube body are integral.

Furthermore, there are multiple second diversion inlets, which are uniformly arranged at the top of the fourth tube bodies.

According to a second aspect of the embodiments of the present disclosure, a cooling system includes a cooling cabinet and a heat exchanging device. The cooling cabinet is configured to cool a to-be-cooled device and includes a cabinet body, a first diversion assembly, and a second diversion assembly, which are disposed in the cabinet body. The first diversion assembly and the second diversion assembly are respectively located at two sides of the to-be-cooled device. The cabinet body may contain a cooling medium for at least partially immersing the to-be-cooled device, and the cabinet body has a first diversion inlet for introducing the cooling medium and a first diversion outlet for discharging the cooling medium. The first diversion assembly is coupled to the first diversion inlet, and the first diversion assembly has a second diversion outlet for discharging the cooling medium into the cabinet body. The second diversion assembly is coupled to the first diversion outlet, and the second diversion assembly has a second diversion inlet for introducing the cooling medium through the to-be-cooled device. One end of the heat exchanging device is coupled to the cabinet body, and the other end of the heat exchanging device is coupled to an external liquid supply device. The heat exchanging device is configured to drive the cooling medium to circulate in the cabinet body and exchange heat with the cooling medium.

According to a third aspect of the embodiments of the present disclosure, a cooling cabinet for cooling a to-be-cooled device includes a cabinet body and a diversion assembly disposed in the cabinet body. The diversion assembly has multiple distributed diversion outlets. The cabinet body may contain a cooling medium for at least partially immersing the to-be-cooled device, and the cabinet body has a diversion inlet for introducing the cooling medium and a diversion outlet for discharging the cooling medium. The diversion assembly is coupled to the diversion inlet, and the plurality of diversion outlets are configured to discharge the cooling medium into the cabinet body. Alternatively, the diversion assembly is coupled to the diversion outlet, and the diversion outlets are configured to introduce the cooling medium flowing through the to-be-cooled device.

Furthermore, the diversion assembly includes a loop tube portion and a first diversion portion coupled to the loop tube portion. The first diversion portion is coupled to the first diversion inlet, and at least one of the loop tube portion and the first diversion portion has the diversion outlets.

Furthermore, the loop tube portion is a rectangular loop tube structure and includes two first tube bodies and two second tube bodies that are coupled to each other and are connected as an enclosure. The first diversion portion is coupled to any of the first tube bodies, and at least two of the first tube bodies, the second tube bodies, and the first diversion portion have the diversion outlets.

Furthermore, the diversion assembly includes a tube bank portion and a second diversion portion coupled to the tube bank portion. The second diversion portion is coupled to the diversion outlet, and the tube bank portion has the diversion outlets.

Furthermore, the tube bank portion is a rectangular tube bank structure and includes two third tube bodies and multiple fourth tube bodies connected between the two third tube bodies. The fourth tube bodies are coupled to the two third tube bodies. The second diversion portion is coupled to any of the third tube bodies, and the fourth tube bodies have the diversion outlets.

According to a fourth aspect of the embodiments of the present disclosure, a cooling system includes a cooling cabinet and a heat exchanging device. The cooling cabinet is configured to cool a to-be-cooled device and includes a cabinet body and a diversion assembly disposed in the cabinet body, and the diversion assembly has multiple discretely distributed diversion outlets. The cabinet body may contain a cooling medium for at least partially immersing the to-be-cooled device, and the cabinet body has a first diversion inlet for introducing the cooling medium and a first diversion outlet for discharging the cooling medium. The diversion assembly is coupled to the diversion inlet, and the diversion outlets are configured to discharge the cooling medium into the cabinet body. Alternatively, the diversion assembly is coupled to the diversion outlet, and the diversion outlets are configured to introduce the cooling medium through the to-be-cooled device. One end of the heat exchanging device is coupled to the cabinet body, and the other end of the heat exchanging device is coupled to an external liquid supply device. The heat exchanging device is configured to drive the cooling medium to circulate in the cabinet body and exchange heat with the cooling medium.

As can be seen from the above technical solutions, in the cooling cabinet of the present disclosure, by arranging the first diversion assembly and the second diversion assembly on two opposite sides of the to-be-cooled device, the flow field of the cooling medium through the to-be-cooled device is a straight path, so that the entire liquid flow path of the cooling medium is shortened, the resistance is reduced, and the energy consumption required to drive the liquid is correspondingly greatly reduced, thereby achieving the effect of minimum energy consumption. Because diversion outlets are distributed on the diversion assembly, the diversion assembly may be coupled to the diversion inlets of the cabinet body, thus introducing the cooling medium. The diversion outlets can make the cooling medium flow into or out of the cabinet body from different directions, reducing the temperature difference between the cooling mediums, thereby making the flow and temperature of the cooling medium more uniform and achieving higher cooling efficiency. The cooling system drives the cooling medium to circulate in the cooling cabinet through the heat exchanging device to remove heat from the to-be-cooled device, and exchanges heat with the external liquid supply device through the heat exchanging device, so that the cooling medium reaches a low temperature state again, and then circulates back into the cooling cabinet to cool the to-be-cooled device again, thus achieving the purpose of circularly and continuously cooling the to-be-cooled device.

DETAILED DESCRIPTION

Embodiments will be described in detail herein, examples of which are illustrated in the figures. When the following description refers to figures, same numerals in different figures refer to the same or similar elements, unless otherwise indicated. The implementations described in the following embodiments do not represent all implementations consistent with the present disclosure. Instead, they are merely examples of devices and methods consistent with some aspects, as detailed in the appended claims, of the present disclosure.

The terminology used in the present disclosure is for the purpose of describing specific embodiments, but not intended to limit the present disclosure. The singular forms "a", "said" and "the" as used in the present disclosure and the appended claims are also intended to include plural forms unless otherwise other meanings are explicitly indicated. The term "and/or" as used herein refers to encompassing any or all possible combinations of one or more associated listed items.

Although the terms "first," "second," "third," etc., may be used in the present disclosure to describe various types of information, such information should not be limited to these terms. These terms are only used to distinguish the same type of information from each other, depending on the context. For example, depending on the context, "first information" may also be referred to as "second information" without departing from the scope of the present disclosure. Similarly, the second information may also be referred to as the first information. Also, for example, the word "if" as used herein may be interpreted as "at the time of" or "when" or "in response to a determination."

The present disclosure provides a cooling cabinet and a cooling system to improve the cooling efficiency for servers in a data center. The cooling cabinet and the cooling system of the present disclosure will be described in detail below with reference to the drawings. The features in the following embodiments and implementations may be combined with each other.

Embodiment 1

Referring to FIG. 1 to FIG. 4, an embodiment of the present disclosure provides a cooling cabinet 1 that implements a single-phase immersion liquid cooling technology for cooling a to-be-cooled device 900. The to-be-cooled device 900 may be a server in a data center, or it may be another type of device that needs to be cooled. The cooling cabinet 1 includes a cabinet body 10, a first diversion assembly 20, and a second diversion assembly 30. The cabinet body 10 may contain a non-conductive cooling medium for at least partially immersing the to-be-cooled device 900, and the cabinet body 10 has a first diversion inlet 101 for introducing the cooling medium and also has a first diversion outlet 102 for discharging the cooling medium. The first diversion assembly 20 is in communication with (coupled to) the first diversion inlet 101, and the first diversion assembly 20 has a second diversion outlet 200 for discharging the cooling medium into the cabinet body 10; by flowing through the to-be-cooled device 900, the cooling medium can cool the to-be-cooled device 900. The second diversion assembly 30 is in communication with (coupled to) the first diversion outlet 102, and the second diversion assembly 30 has a second diversion inlet 300 for introducing the cooling medium to flow through the to-be-cooled device 900. Optionally, the first diversion assembly 20 and the second diversion assembly 30 are both disposed in the cabinet body 10, and the first diversion assembly 20 and the second diversion assembly 30 are respectively located on two sides of the to-be-cooled device. In the example shown in FIGS. 1-4, the first diversion assembly 20 and the second diversion assembly 30 are respectively located on two sides of the to-be-cooled device in the vertical direction, so that the flow field of the cooling medium is a straight path in the vertical direction, which can avoid extra energy consumption due to gravity when the cooling medium moves in the lateral direction. The cooling medium may completely immerse the to-be-cooled device 900, or may partially immerse the to-be-cooled device 900, depending on actual needs. The cooling medium may be a gaseous medium, a liquid medium, or a solid-liquid mixed medium, which also depends on actual needs. In an embodiment, the cooling medium completely immerses the to-be-cooled device 900, and the cooling medium is a liquid electronic fluorinated liquid. The cooling medium is discharged into the cabinet body 10 through the first diversion assembly 20, and the cooling medium that flows through the to-be-cooled device 900 is discharged out of the cabinet body 10 through the second diversion assembly 30. However, in other embodiments, the first diversion assembly 20 is coupled to the first diversion outlet 102, and the second diversion assembly 30 is coupled to the first diversion inlet 101. In these embodiments, the cooling medium can be introduced into the cabinet body 10 through the second diversion assembly 30, and the cooling medium that flows through the to-be-cooled device 900 can be discharged out of the cabinet body 10 through the first diversion assembly 20.

As can be seen from the above technical solution, in the cooling cabinet 1 of the present disclosure, the cooling medium enters the cabinet body 10 from the first diversion inlet 101 of the cabinet body 10 and is then discharged to the to-be-cooled device 900 through the second diversion outlet 200 of the first diversion assembly 20; the cooling medium flowing through the to-be-cooled device 900 removes heat from the to-be-cooled device 900, and then enters the second diversion assembly 30 through the second diversion inlet 300 of the second diversion assembly 30, and finally is discharged out of the cabinet body 10 through the first diversion outlet 102 of the cabinet body 10. In this manner, the purpose of dissipating the heat of the to-be-cooled device 900 is achieved. By arranging the first diversion assembly 20 and the second diversion assembly 30 on two opposite sides of the to-be-cooled device 900, the flow field of the cooling medium flowing through the to-be-cooled device 900 is a straight path, so that the entire liquid flow path of the cooling medium is the shortened, the resistance is the reduced, and the energy consumption required to drive the liquid is correspondingly greatly reduced, thereby achieving the effect of minimum energy consumption. In addition, the cooling medium flows along a linear flow path, and cold and hot fluids are completely isolated from each other, which can prevent the cold and hot fluids from mixing with each other, thereby improving the cooling effect.

Figure 1:
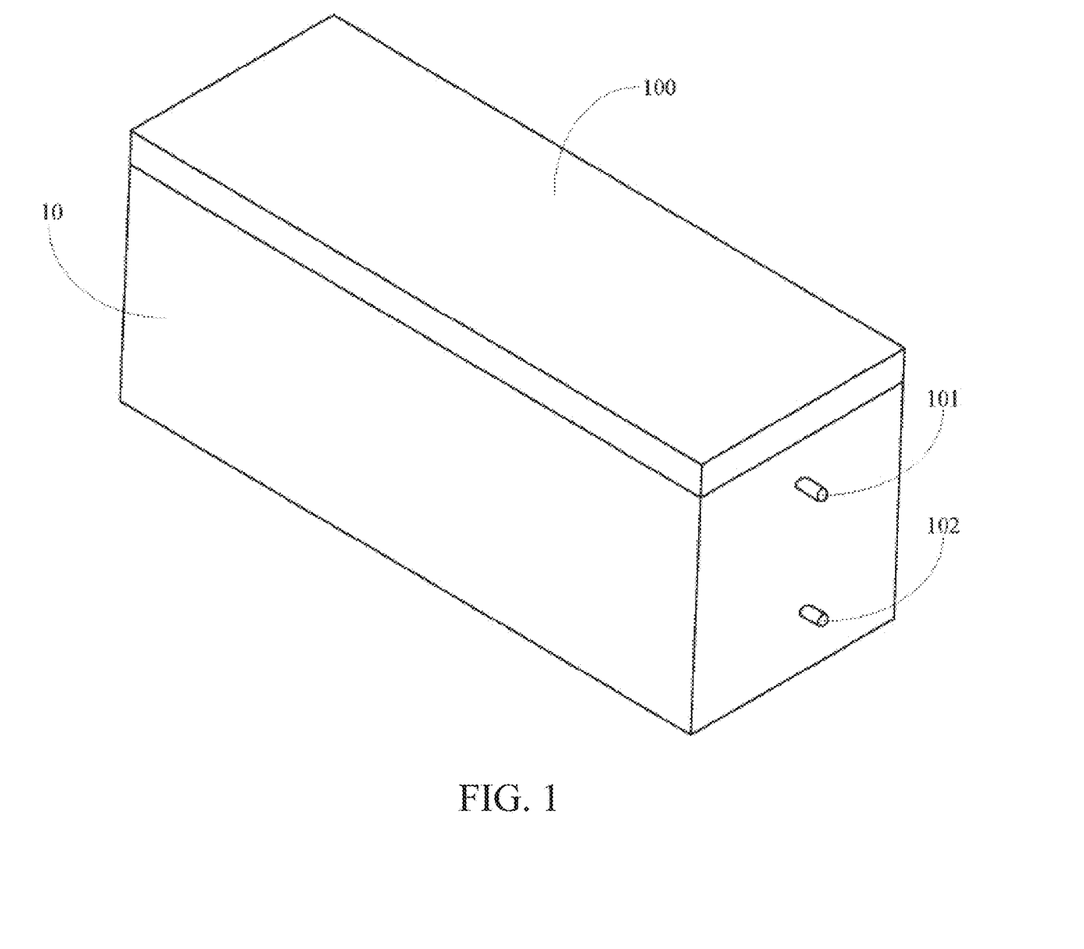
FIG. 1 is a schematic perspective view of a cooling cabinet according to an example embodiment of the present disclosure.

As shown in FIG. 1, in an optional implementation, a cover 100 is detachably disposed at the top of the cabinet body 10 using fasteners. When the to-be-cooled device 900 is placed in the cabinet body 10, the fasteners are removed to open the cover 100, and the to-be-cooled device 900 then can be placed in the cabinet body 10. After the to-be-cooled device 900 is placed in the cabinet body 10, the cover 100 is closed to seal the cabinet body 10.

Figure 2:
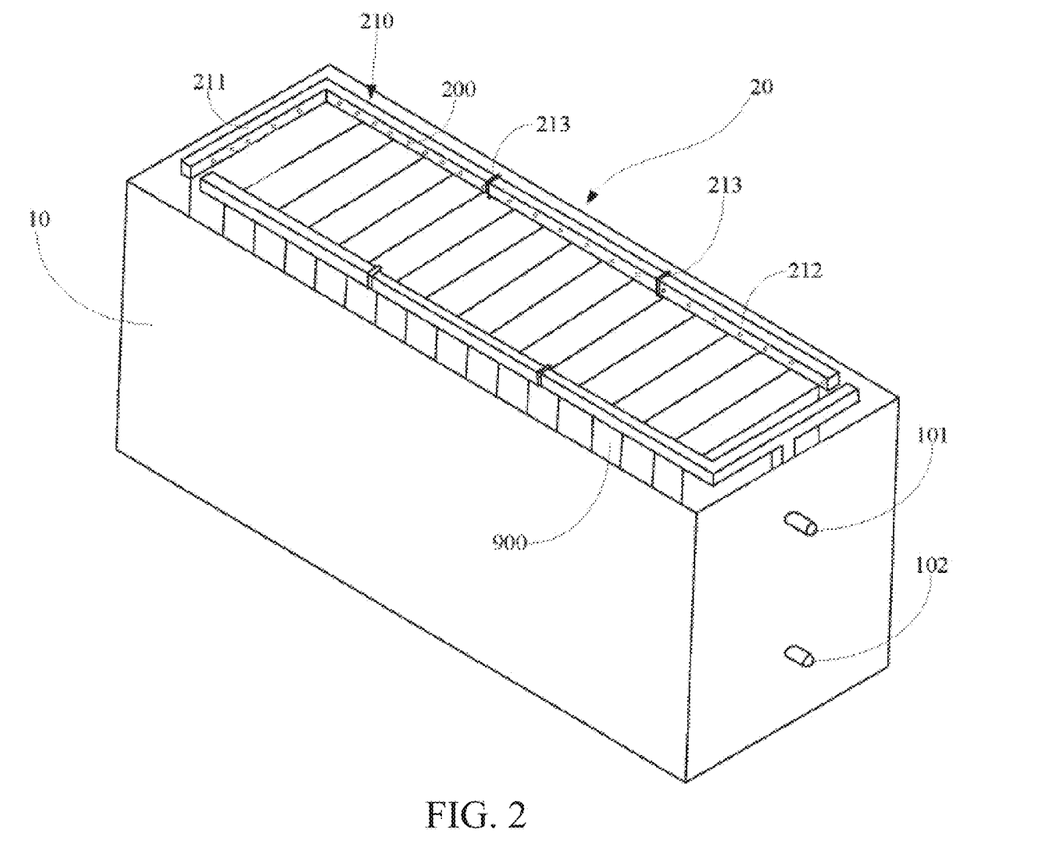
FIG. 2 is a schematic perspective view of a cooling cabinet according to an example embodiment of the present disclosure, with a cover removed.
Figure 3:
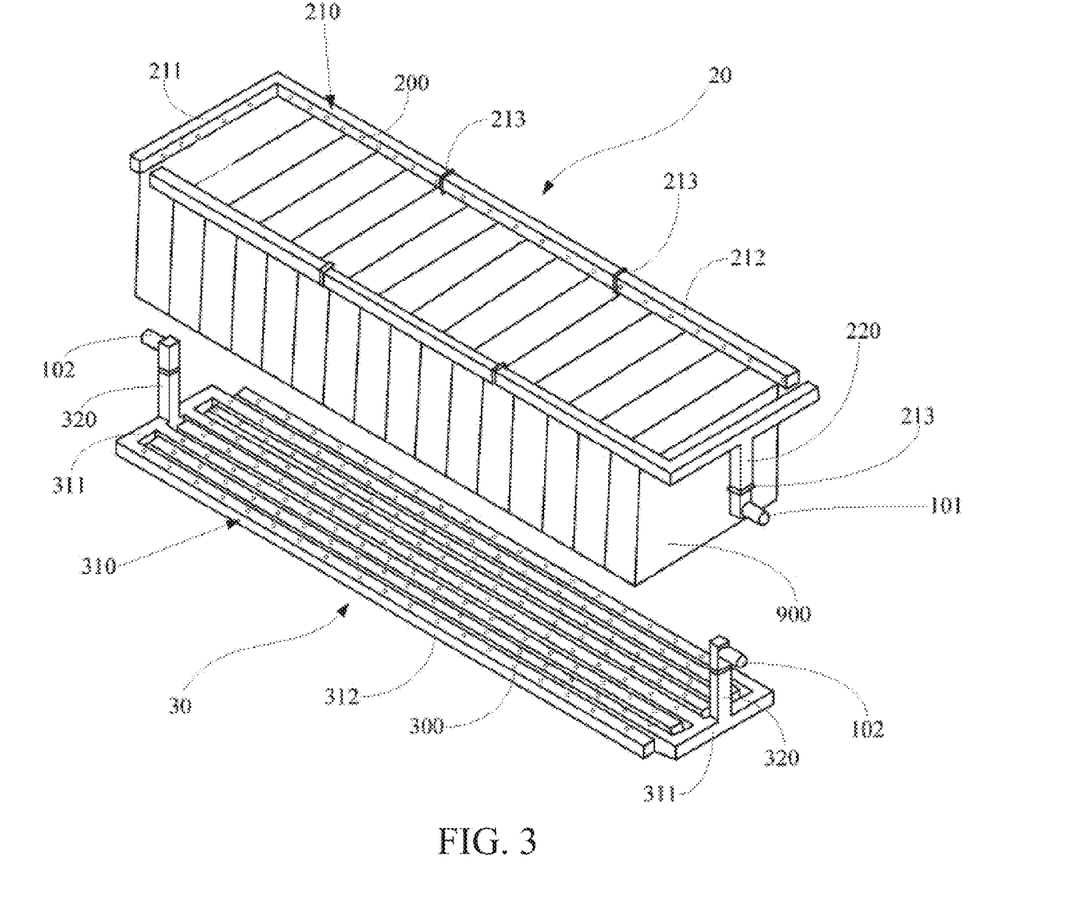
FIG. 3 is a schematic perspective view of a cooling cabinet according to an example embodiment of the present disclosure, with a cover and a cabinet body removed.

Referring to FIGS. 2 and 3, in an optional implementation, the first diversion inlet 101 is located above the first diversion outlet 102. Accordingly, the first diversion assembly 20 is located at the top of the to-be-cooled device 900, and the second diversion assembly 30 is located at the bottom of the to-be-cooled device 900. However, in another optional implementation, the first diversion inlet 101 is located below the first diversion outlet 102. Accordingly, the first diversion assembly 20 is located at the bottom of the to-be-cooled device 900, and the second diversion assembly 30 is located at the top of the to-be-cooled device 900. The flow field of the cooling medium flowing through the to-be-cooled device 900 thus can have a straight path directly from top to bottom or from bottom to top, so that the entire liquid flow path of the cooling medium is the shortened and the resistance is reduced.

Figure 4:
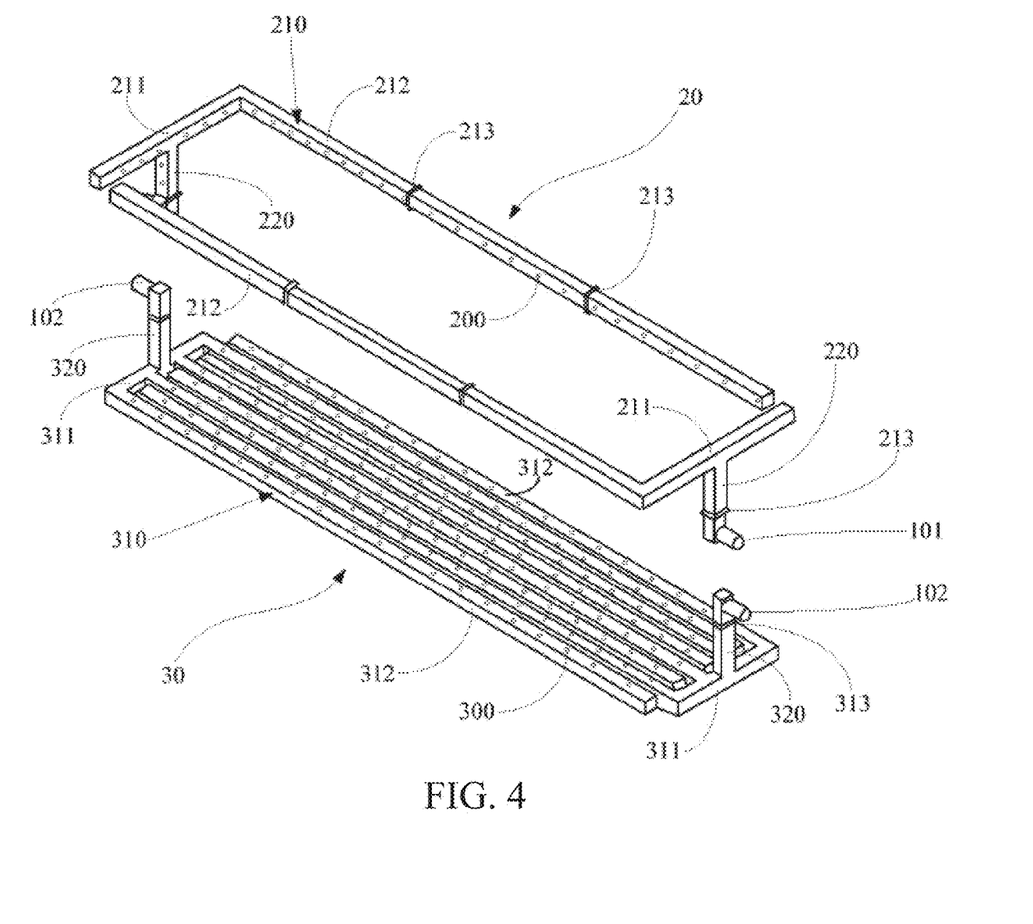
FIG. 4 is a schematic perspective view of a first diversion assembly and a second diversion assembly in a cooling cabinet according to an example embodiment of the present disclosure.

Referring to FIG. 4, in an optional implementation, the first diversion assembly 20 includes a loop tube portion 210 and a first diversion portion 220 coupled to the loop tube portion 210. The first diversion portion 220 is coupled to the first diversion inlet 101, and at least one of the loop tube portion 210 and the first diversion portion 220 has the second diversion outlet 200. In an embodiment, the loop tube portion 210 and the first diversion portion 220 both have the second diversion outlet 200. After entering the first diversion assembly 20 from the first diversion inlet 101 of the cabinet body 10, the cooling medium is discharged into the cabinet body 10 through the second diversion outlet 200 (disposed in the loop tube portion 210) and the first diversion portion 220, and then flows through the to-be-cooled device 900 to cool the to-be-cooled device 900.

Furthermore, the loop structure of the loop tube portion 210 may correspond (e.g., in shape) with the to-be-cooled device 900 (e.g., with the cross-sectional structure of the to-be-cooled device 900), so that the cooling medium flowing out of the first diversion assembly 20 can flow along the periphery of the to-be-cooled device 900 to achieve greater cooling efficiency. For example, the cross-sectional structure of the to-be-cooled device 900 is rectangular, and the loop tube portion 210 is a rectangular loop tube structure corresponding in shape to the cross-sectional structure. However, the cross-sectional structure of the to-be-cooled device 900 may have other shapes, and the loop structure of the loop tube portion 210 can correspond to the cross-sectional structure of the different shapes.

As just described, in an optional implementation, the cross-sectional structure of the to-be-cooled device 900 is rectangular, and the loop tube portion 210 is a rectangular loop tube structure corresponding to the cross-sectional structure of the to-be-cooled device 900. The loop tube portion 210 includes two first tube bodies 211 and two second tube bodies 212, which communicate with each other (are coupled to each other) and are connected in a manner that forms an enclosure. The first diversion portion 220 is coupled to any of the first tube bodies 211, and at least one of the first tube bodies 211, the second tube bodies 212, and the first diversion portion 220 has the second diversion outlets 200 in the side wall. In an embodiment, the inner walls of the first tube bodies 211, the first tube bodies 212, and the first diversion portion 220 are all provided with the second diversion outlets 200. After entering the first diversion assembly 20 from the first diversion inlet 101 of the cabinet body 10, the cooling medium is discharged into the cabinet body 10 through the second diversion outlet 200 disposed in the first tube bodies 211, the second tube bodies 212, and the first diversion portion 220, and then flows through the to-be-cooled device 900 to cool the to-be-cooled device 900.

In an optional implementation, there are two first diversion inlets 101 respectively disposed on two sides of the cabinet body 10. Correspondingly, there are two first diversion portions 220 which communicate with the two first tube bodies 211 in one-to-one correspondence. In this manner, the circulation speed of the cooling medium can be increased, and further the cooling efficiency of the to-be-cooled device 900 can be improved.

In an optional implementation, the length of the first tube body 211 is shorter than the length of the second tube body 212. A reinforcing ring 213 is fitted on the first tube body 211, and a number of reinforcing rings 213 are fitted on the second tube body 212 at intervals, which can enhance the structural strength of the first diversion assembly 20. Furthermore, each of the two first tube bodies 211 is integral with at least one of the adjacent second tube bodies 212. That is, each of the two first tube bodies 211 may be integral with a corresponding one of the two second tube bodies 212, or the two first tube bodies 211 and the two second tube bodies 212 are respectively integral, which can further enhance the structural strength of the first diversion assembly 20.

In an optional implementation, the second diversion assembly 30 includes a tube bank portion 310 and a second diversion portion 320 coupled to the tube bank portion 310. The second diversion portion 320 is coupled to the first diversion outlet 102, and the tube bank portion 310 has the second diversion inlet 300. The cooling medium flowing through the to-be-cooled device 900 removes heat from the to-be-cooled device 900, and then enters the second diversion assembly 30 through the second diversion inlet 300 disposed on the tube bank portion 310, and finally is discharged out of the cabinet body 10 through the first diversion outlet 102 of the cabinet body 10. In this manner, the purpose of dissipating the heat of the to-be-cooled device 900 is achieved.

Furthermore, the tube bank structure of the tube bank portion 310 may correspond (e.g., in shape) to the cross-sectional structure of the to-be-cooled device 900, so that the cooling medium flowing through the to-be-cooled device 900 can flow into the second diversion assembly 30 to the extent possible, and then is discharged from the first diversion outlet 102 of the cabinet body 10, thereby increasing the circulation speed of the cooling medium. For example, the shape of the cross-sectional structure of the to-be-cooled device 900 is rectangular, and the shape of the tube bank structure of the tube bank portion 310 is a rectangular tube bank structure corresponding to the cross-sectional structure of the to-be-cooled device 900. However, the cross-sectional structure of the to-be-cooled device 900 may have other shapes, and the shape of the tube bank structure of the tube bank portion 310 can correspond to the cross-sectional structure of the different shapes.

In an optional implementation, the cross-sectional structure of the to-be-cooled device 900 is rectangular as just described, and the tube bank portion 310 is a rectangular tube bank structure corresponding to the shape of the cross-sectional structure. The tube bank portion 310 includes two third tube bodies 311 and multiple fourth tube bodies 312 connected between the two third tube bodies 311. The fourth tube bodies 312 are each coupled to the two third tube bodies 311. The second diversion portion 320 is coupled to any one of the third tube bodies 311, and the second diversion inlets 300 are disposed at the top of the fourth tube bodies 312. The cooling medium flowing through the to-be-cooled device 900 removes heat from the to-be-cooled device 900, and then enters the second diversion assembly 30 through the second diversion inlets 300 disposed on the fourth tube bodies 312, and finally is discharged out of the cabinet body 10 through the first diversion outlet 102 of the cabinet body 10. In this manner, the purpose of dissipating the heat of the to-be-cooled device 900 is achieved.

In an optional implementation, there are two first diversion outlets 102 disposed on two sides of the cabinet body 10 respectively. Correspondingly, there are two second diversion portions 320 that communicate with the two third tube bodies 311 in one-to-one correspondence. In this manner, the circulation speed of the cooling medium can be increased, and further the cooling efficiency of the to-be-cooled device 900 can be improved.

In an optional implementation, the length of the third tube body 311 is shorter than the length of the fourth tube body 312, and a reinforcing ring 313 is fitted on the third tube body 311, which can enhance the structural strength of the second diversion assembly 30. Optionally, the fourth tube bodies 312 include two groups arranged in a staggered manner. One group of the fourth tube bodies 312 and one of the third tube bodies 311 are integral, and the other group of the fourth tube bodies 312 and the other third tube body 311 are integral; that is, the fourth tubes bodies 312 and the two third tube bodies 311 form an integrated structure of two integrated rake-like structures, which can further enhance the structural strength of the second diversion assembly 30.

In an optional implementation, there are a number of second diversion outlets 200, and the second diversion outlets 200 are uniformly arranged on at least one of the first tube bodies 211, the second tube bodies 212, and the first diversion portion 220 of the first diversion assembly 20. In the embodiment shown in the figure, the inner walls of the first tube bodies 211, the second tube bodies 212, and the first diversion portion 220 of the first diversion assembly 20 have uniformly arranged second diversion outlets 200. There are multiple second diversion inlets 300, and the second diversion inlets 300 are uniformly arranged at the top of the fourth tube bodies 312 of the second diversion assembly 30. In this manner, the cooling medium may flow through the to-be-cooled device 900 more evenly, which is beneficial to improving the cooling efficiency.

Figure 5:
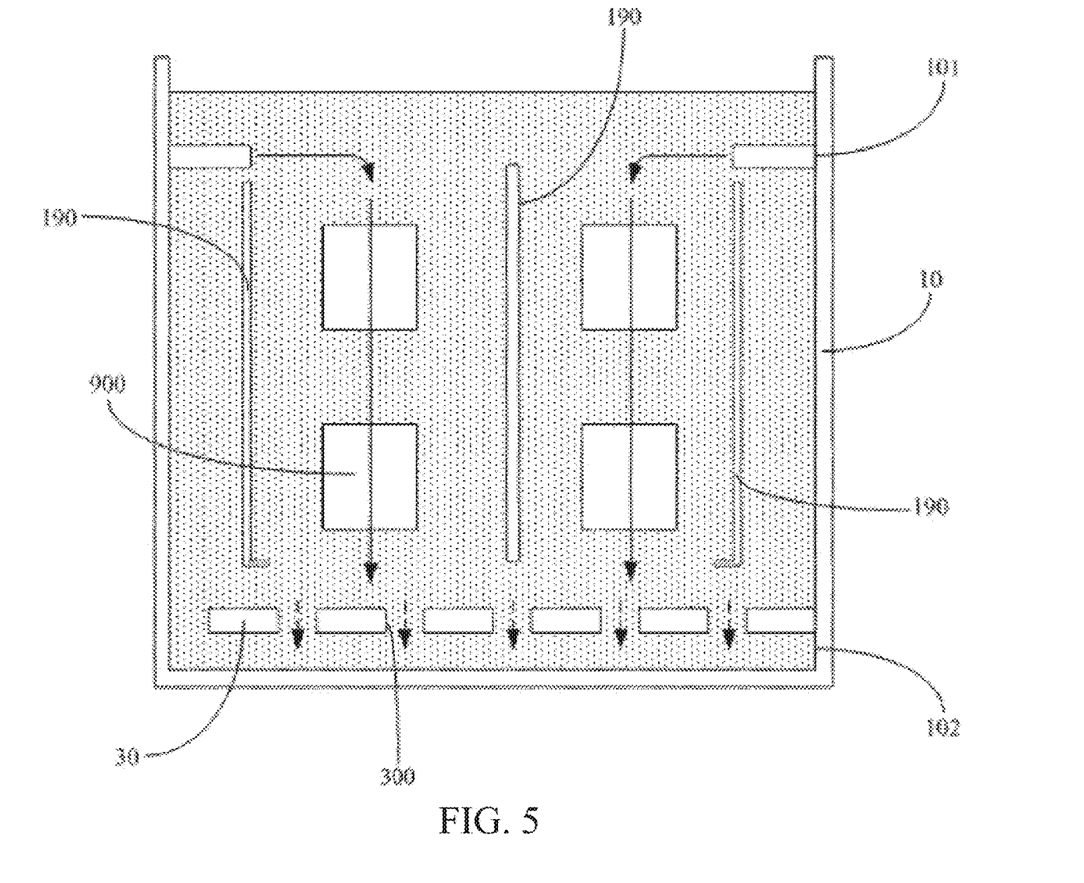
FIG. 5 is a schematic view of a flow field of a cooling cabinet according to an example embodiment of the present disclosure.

The operation of the cooling cabinet 1 in the present disclosure will be described with reference to FIGS. 3-5, which show an example where the first diversion inlet 101 is located above the first diversion outlet 102, the first diversion assembly 20 is located at the top of the to-be-cooled device 900, and the second diversion assembly 30 is located at the bottom of the to-be-cooled device 900. The cooling cabinet 1 of the present disclosure has multiple plug-in components 190 configured for installing the to-be-cooled devices 900, and the to-be-cooled devices 900 may each be of a sheet-type structure that are plugged into the plug-in components 190. After entering the first diversion assembly 20 from the first diversion inlet 101 of the cabinet body 10, the cooling medium 80 is discharged into the cabinet body 10 through the second diversion outlet 200 of the first diversion assembly 20, and then flows down through the to-be-cooled devices 900. The cooling medium 80 flowing through the to-be-cooled device 900 removes heat from the to-be-cooled device 900, and then enters the second diversion assembly 30 through the second diversion inlet 300 of the second diversion assembly 30, and finally is discharged out of the cabinet body 10 through the first diversion outlet 102 of the cabinet body 10. In this manner, the purpose of dissipating the heat of the to-be-cooled device 900 is achieved. The dotted arrows in FIGS. 5 and 6 indicate the flow direction of the cooling medium in a hot liquid (fluid) state, and the solid arrows indicate the flow direction of the cooling medium in a cold liquid (fluid) state. By arranging the first diversion assembly 20 at the top of the to-be-cooled device 900, and arranging the second diversion assembly 30 at the bottom of the to-be-cooled device 900, the flow field of the cooling medium 80 flowing through the to-be-cooled device 900 is a straight path from top to bottom, so that the entire liquid flow path of the cooling medium is shortened, the resistance is reduced, and the energy consumption required to drive the liquid is correspondingly greatly reduced, thereby reducing energy consumption. In addition, the cooling medium flows along a linear flow path, and cold and hot fluids are completely isolated from each other, which can prevent the cold and hot fluids from mixing with each other, thereby improving the cooling effect.

Figure 6:
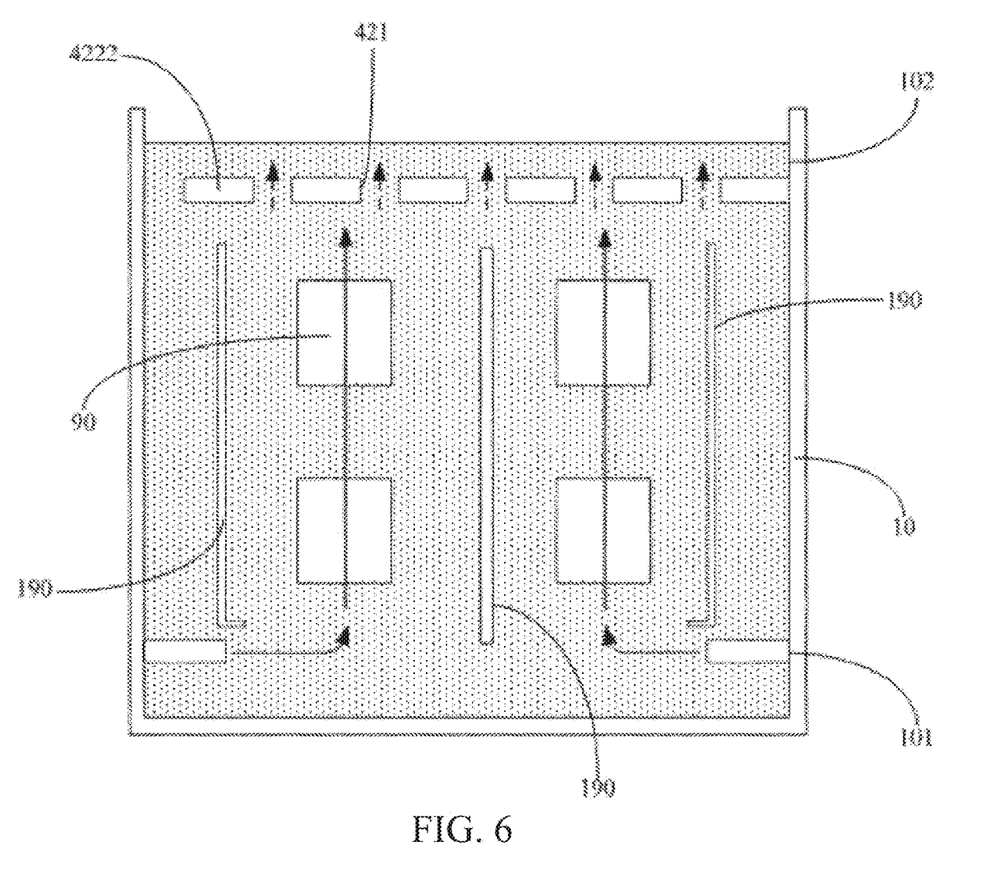
FIG. 6 is a schematic view of a flow field of another cooling cabinet according to an example embodiment of the present disclosure.

The working principle of the cooling cabinet 1 in the present disclosure will be described with reference to FIG. 6, which shows an example where the first diversion inlet 101 is located below the first diversion outlet 102, the first diversion assembly 20 is located at the bottom of the to-be-cooled device 900, and the second diversion assembly 30 is located at the top of the to-be-cooled device 900. The cooling cabinet 1 of the present disclosure has multiple plug-in components 190 for installing the to-be-cooled devices 900. The to-be-cooled devices 900 may each be of a sheet-type structure that can be plugged into the plug-in components 190. After entering the first diversion assembly 20 from the first diversion inlet 101 of the cabinet body 10, the cooling medium 80 is discharged into the cabinet body 10 through the second diversion outlet 200 of the first diversion assembly 20, and then flows up through the to-be-cooled devices 900. The cooling medium 80 flowing through the to-be-cooled device 900 removes heat from the to-be-cooled device 900, and then enters the second diversion assembly 30 through the second diversion inlet 300 of the second diversion assembly 30, and finally is discharged out of the cabinet body 10 through the first diversion outlet 102 of the cabinet body 10. In this manner, the purpose of dissipating the heat of the to-be-cooled device 900 is achieved. The dotted arrows in FIGS. 5 and 6 indicate the flow direction of the cooling medium in a hot liquid (fluid) state, and the solid arrows indicate the flow direction of the cooling medium in a cold liquid (fluid) state. By arranging the first diversion assembly 20 at the bottom of the to-be-cooled device 900 and arranging the second diversion assembly 30 at the top of the to-be-cooled device 900, the flow field of the cooling medium 80 flowing through the to-be-cooled device 900 is a straight path from bottom to top, so that the entire liquid flow path of the cooling medium is the shortened, the resistance is reduced, and the energy consumption required to drive the liquid is correspondingly greatly reduced, thereby achieving the effect of minimum energy consumption. In addition, the cooling medium flows along a linear flow path, and cold and hot fluids are completely isolated from each other, which can prevent the cold and hot fluids from mixing with each other, thereby improving the cooling effect.

Embodiment 2

An embodiment of the present disclosure further provides a cooling cabinet for cooling a to-be-cooled device. The cooling cabinet includes a cabinet body and a diversion assembly disposed in the cabinet body, and the diversion assembly has multiple discretely distributed diversion outlets. The cabinet body may contain a cooling medium for at least partially immersing the to-be-cooled device, and the cabinet body has a first diversion inlet for introducing the cooling medium and a first diversion outlet for discharging the cooling medium. The diversion assembly is coupled to the diversion inlet, and the diversion outlets are configured to discharge the cooling medium into the cabinet body; or the diversion assembly is coupled to the diversion outlet, and the diversion outlets are configured to introduce the cooling medium through the to-be-cooled device.

As can be seen from the above technical solutions, in the cooling cabinet of the present disclosure, because multiple diversion outlets are disposed and distributed on the diversion assembly, the diversion assembly may be coupled to the diversion inlet of the cabinet body, thus introducing the cooling medium. The diversion assembly may also be coupled to the diversion outlet of the cabinet body to discharge the cooling medium. However, regardless of the disclosed arrangements, the diversion outlets can make the cooling medium flow into or out of the cabinet body from different directions, reducing the temperature difference between the cooling mediums, thereby making the flow and temperature of the cooling medium more uniform and achieving higher cooling efficiency.

When the diversion assembly is coupled to the diversion inlet, the diversion assembly functions as the first diversion assembly described in Embodiment 1, and the diversion outlets function as the second diversion outlet described in Embodiment 1; in this case, for the structure of the diversion assembly, reference may be made to the description of the first diversion assembly in Embodiment 1. When the diversion assembly is coupled to the diversion outlet, the diversion assembly functions as the second diversion assembly described in Embodiment 1, and the diversion outlets function as the second diversion inlet described in Embodiment 1; in this case, for the structure of the diversion assembly, reference may be made to the description of the second diversion assembly in Embodiment 1.

Embodiment 3

An embodiment of the present disclosure further provides a cooling system, including the cooling cabinet as described in Embodiment 1 or Embodiment 2 above, and also including a heat exchanging device connected to the cooling cabinet. The description of the cooling cabinet in the Embodiments 1 and 2 above is also applicable to the cooling system of the present embodiment. The cooling system described in Embodiment 1 is taken as an example to describe the cooling system of the present embodiment.

Figure 7:
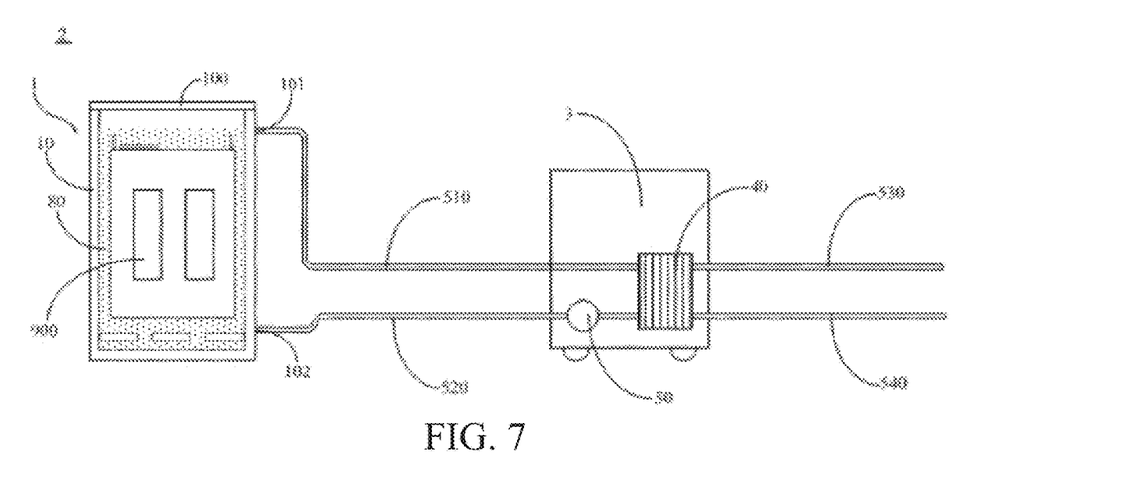
FIG. 7 is a schematic structural diagram of a cooling system according to an example embodiment of the present disclosure.

Referring to FIG. 7, the cooling system 2 of the present embodiment includes the cooling cabinet 1 described in Embodiment 1 and a heat exchanging device 3 connected to the cooling cabinet 1. One end of the heat exchanging device 3 is coupled to the cabinet body 10 of the cooling cabinet 1, and the other end of the heat exchanging device 3 is coupled to an external liquid supply device (not shown). The heat exchanging device 3 is configured to drive the cooling medium to circulate in the cabinet body 10 of the cooling cabinet 1 and exchange heat with the cooling medium.

As can be seen from the above technical solutions, the cooling system 2 of the present embodiment drives the cooling medium to circulate in the cooling cabinet 1 through the heat exchanging device 3, to remove heat from the to-be-cooled device 900, and exchanges heat with the external liquid supply device through the heat exchanging device 3, so that the cooling medium reaches a low temperature state again, and then circulates into the cooling cabinet 1 to cool the to-be-cooled device 900 again, thus achieving the purpose of circularly (cyclically) and continuously cooling the to-be-cooled device 900.

In an optional embodiment, the heat exchanging device 3 includes a heat exchanger 40 and a pump 50. The heat exchanger 40 is connected to the cooling cabinet 1 through a first circulation loop, and is connected to the external liquid supply device through a second circulation loop. The first circulation loop includes a first pipeline 510 and a second pipeline 520, and the second circulation loop includes a third pipeline 530 and a fourth pipeline 540. The first pipeline 510 is coupled to the first diversion inlets 101 of the cooling cabinet 1, the second pipeline 520 is coupled to the first diversion outlets 102 of the cooling cabinet 1, and the third pipeline 530 and the fourth pipeline 540 are both coupled to the external liquid supply device. When the cooling system 2 of the present embodiment is in operation, the pump 50 drives the cooling medium to circulate in the cooling cabinet 1 through the first circulation loop, and the cooling medium removes heat from the to-be-cooled device 900 through circulation in the cooling cabinet 1 and enters the heat exchanger 40 of the heat exchanging device 3. The external liquid supply device can circulate cooling water in the second circulation loop, and the cooling system carrying the heat from the to-be-cooled device 900 may exchange heat in the heat exchanger 40 with the cooling water provided by the external liquid supply device to discharge the heat carried by the cooling system, so that the cooling medium reaches a low temperature state again, and then circulates into the cooling cabinet 1 to cool the to-be-cooled device 900 again, thus achieving the purpose of circularly and continuously cooling the to-be-cooled device 900.

Those skilled in the art will readily conceive of other implementation solutions of the present disclosure after considering the disclosure and practicing the invention disclosed herein. The present disclosure is intended to cover any variations, uses, or adaptations of the present disclosure. These modifications, uses, or adaptations follow the general principles of the present disclosure and include the common general knowledge or conventional technical means in the technical field not disclosed in the present disclosure. The disclosure and embodiments are considered as examples only, with a true scope and spirit of the present disclosure being indicated by the following claims.

It should be further noted that the terms "include," "comprise," or any other variations thereof are intended to cover non-exclusive inclusions such that a process, method, article, or device that includes a series of elements not only includes those elements but also includes other elements that are not listed explicitly, or also include inherent elements of the process, method, article, or device. In the absence of more limitations, an element defined by the sentence "including a/an . . . " does not exclude that the process, method, article or device including the element further has other identical elements.

The embodiments described above are merely embodiments of the present disclosure and not intended to limit the present disclosure. Any of modifications, equivalent substitutions, improvements and the like, made within the spirit and principle of the present disclosure, shall be covered in the scope of the present disclosure.

Embodiments according to the invention are thus described. While the present disclosure has been described in particular embodiments, it should be appreciated that the invention should not be construed as limited by such embodiments, but rather construed according to the following claims.

What is claimed is:

1. A cooling cabinet for cooling a to-be-cooled device, wherein the cooling cabinet comprises:
   a cabinet body;
   a first diversion assembly coupled to the cabinet body; and
   a second diversion assembly coupled to the cabinet body, wherein the cabinet body is configured to contain a cooling medium for at least partially immersing the to-be-cooled device, wherein the cabinet body comprises a first diversion inlet for receiving the cooling medium and a first diversion outlet for discharging the cooling medium, wherein the first diversion assembly is coupled to the first diversion inlet and comprises a second diversion outlet for discharging the cooling medium into the cabinet body, wherein the second diversion assembly is coupled to the first diversion outlet and comprises a second diversion inlet for receiving the cooling medium, wherein the first diversion assembly and the second diversion assembly are arranged on two opposite sides of the to-be-cooled device in a vertical direction so that a flow field of the cooling medium flows through the to-be-cooled device in a straight path between the first diversion assembly and the second diversion assembly, and wherein the second diversion assembly comprises a tube bank portion and a second diversion portion coupled to the tube bank portion, the second diversion portion is coupled to the first diversion outlet, and the tube bank portion comprises the second diversion inlet.

2. The cooling cabinet according to claim 1, wherein the first diversion inlet is located above the first diversion outlet, the first diversion assembly is located at a top of the to-be-cooled device, and the second diversion assembly is located at a bottom of the to-be-cooled device.

3. The cooling cabinet according to claim 1, wherein the first diversion inlet is located below the first diversion outlet, the first diversion assembly is located at a bottom of the to-be-cooled device, and the second diversion assembly is located at a top of the to-be-cooled device.

4. The cooling cabinet according to claim 1, wherein the first diversion assembly comprises a loop tube portion and a first diversion portion coupled to the loop tube portion, the first diversion portion is coupled to the first diversion inlet, and at least one of the loop tube portion and the first diversion portion comprises the second diversion outlet.

5. The cooling cabinet according to claim 4, wherein the loop tube portion is a rectangular loop tube structure and comprises two first tube bodies and two second tube bodies coupled to each other, wherein the first diversion portion is coupled to the two first tube bodies, and wherein at least one of the two first tube bodies, the two second tube bodies, and the first diversion portion comprises the second diversion outlet.

6. The cooling cabinet according to claim 5, wherein there are two first diversion inlets, which are respectively disposed on two sides of the cabinet body, and wherein there are two first diversion portions coupled to the two first tube bodies.

7. The cooling cabinet according to claim 5, wherein each of the two first tube bodies is integrally formed with at least one of the adjacent two second tube bodies.

8. The cooling cabinet according to claim 5, comprising a plurality of second diversion outlets that is uniformly spaced on a side wall of at least one of the two first tube bodies, the two second tube bodies, and the first diversion portion.

9. The cooling cabinet according to claim 1, wherein the tube bank portion is a rectangular tube bank structure and comprises two first tube bodies and a plurality of second tube bodies connected between the two first tube bodies, wherein the plurality of second tube bodies is coupled to the two first tube bodies, and wherein the second diversion portion is coupled to the two first tube bodies, and the plurality of second tube bodies comprises the second diversion inlet.

10. The cooling cabinet according to claim 9, wherein there are two first diversion outlets, which are respectively disposed on two sides of the cabinet body, and wherein there are two second diversion portions coupled to the two first tube bodies.

11. The cooling cabinet according to claim 9, wherein the plurality of second tube bodies includes two groups of the plurality of second tube bodies arranged in a staggered manner, wherein one group of the plurality of second tube bodies and one of the two first tube bodies are integrally formed, and other group of the plurality of second tube bodies and other of the two first tube bodies are integrally formed.

12. The cooling cabinet according to claim 9, wherein there is a plurality of second diversion inlets, which is uniformly spaced at top of the plurality of second tube bodies.

* * * * *